United States Patent
Zach et al.

(10) Patent No.: US 7,600,212 B2
(45) Date of Patent: Oct. 6, 2009

(54) METHOD OF COMPENSATING PHOTOMASK DATA FOR THE EFFECTS OF ETCH AND LITHOGRAPHY PROCESSES

(75) Inventors: Franz X. Zach, Los Gatos, CA (US); Jesus Carrero, San Jose, CA (US); Bayram Yenikaya, Sunnyvale, CA (US); Gokhan Percin, Los Gatos, CA (US); Xuelong Cao, Fremont, CA (US); Abdurrahman Sezginer, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 213 days.

(21) Appl. No.: 11/541,921

(22) Filed: Oct. 2, 2006

(65) Prior Publication Data

US 2007/0143733 A1 Jun. 21, 2007

Related U.S. Application Data

(60) Provisional application No. 60/723,563, filed on Oct. 3, 2005.

(51) Int. Cl.
*G06F 17/50* (2006.01)
(52) U.S. Cl. .................................. 716/19; 716/4; 716/21
(58) Field of Classification Search ........................ None
See application file for complete search history.

(56) References Cited

U.S. PATENT DOCUMENTS

| | | | |
|---|---|---|---|
| 6,194,104 B1 * | 2/2001 | Hsu | 430/5 |
| 6,453,457 B1 * | 9/2002 | Pierrat et al. | 716/19 |
| 6,553,558 B2 * | 4/2003 | Palmer et al. | 716/19 |
| 6,961,920 B2 * | 11/2005 | Zach | 716/21 |
| 7,043,712 B2 * | 5/2006 | Mukherjee et al. | 716/19 |
| 7,278,125 B2 * | 10/2007 | Nojima | 716/5 |
| 7,328,425 B2 * | 2/2008 | Olsson et al. | 716/21 |
| 7,334,212 B2 * | 2/2008 | Zach | 716/21 |
| 7,403,649 B2 * | 7/2008 | Cai et al. | 382/141 |
| 2006/0248495 A1 | 11/2006 | Sezginer | 716/19 |
| 2006/0248496 A1 | 11/2006 | Sezginer et al. | 716/20 |
| 2006/0248497 A1 | 11/2006 | Huang et al. | 716/21 |
| 2006/0248498 A1 | 11/2006 | Sezginer et al. | 716/21 |

OTHER PUBLICATIONS

Beale et al., "Multiple Stage Optical Proximity Correction," SPIE vol. 5040, pp. 1202-1209, 2003.
Choi et al., "Hybrid PPC Methodology Using Multi-Step Correction And Implementation For The Sub-100nm Node," Proc SPIE, vol. 5040, pp. 1176-1183, 2003.

(Continued)

*Primary Examiner*—Leigh Marle Garbowski
(74) *Attorney, Agent, or Firm*—Sheppard Mullin Richter & Hampton LLP (57) ABSTRACT

A method for synthesizing a photomask data set from a given target layout, including the following steps: (a) providing a set of target polygons for the target layout; (b) fitting a smooth curve to a target polygon of the set of target polygons, the curve having a set of etch-target points; (c) moving the etch target points according to a model of an etch process to produce a set of lithography-target points; and (d) synthesizing a photomask data set based on a model of a lithography process and the set of lithography-target points.

55 Claims, 7 Drawing Sheets

OTHER PUBLICATIONS

Overmars, M.H. and E. Welzl, "Construction of Sparse Visibility Graphs," Technical Report RUU-CS-87-9, Department of Computer Science, University of Utrecht, 1987 p. 4-21, 23-26.

Ghosh, S. K. and Mount, D. M. "An Output Sensitive Algorithm for Computing Visibility Graphs," SIAM J. Comput. vol. 20, No. 5, pp. 888-910, Oct. 1991.

Lee, D. T., "Proximity and Reachability In The Plane," Ph.D. Thesis and Tech Report ACT-12, Coordinated Science Laboratory, University of Illinois at Urbana-Champaign, Urbana, IL, 1978 p. 1-150.

Kitzinger, J., "The Visibility Graph Among Obstacles: A Comparison of Algorithms," M.S. Thesis, Department of Computer Science, University of Mexico, 2003 p. 1-62.

* cited by examiner

METHOD OF COMPENSATING PHOTOMASK DATA FOR THE EFFECTS OF ETCH AND LITHOGRAPHY PROCESSES

RELATED APPLICATION

Priority is claimed from U.S. Provisional Patent Application 60/723,563, filed Oct. 3, 2005, and said Provisional patent Application is incorporated herein by reference.

FIELD OF THE INVENTION

This invention relates to the field of fabrication of integrated circuits and, more particularly, to a method of compensating photomask data for the effects of etch and lithograph processes.

BACKGROUND OF THE INVENTION

In the fabrication of integrated circuits, layers of semiconductor devices are patterned using lithography and etch processes. Both of these processes distort the pattern. The pattern on the photomask can be changed in order to compensate for the combined distortion of lithography and etch processes. The photomask data set describes a pattern $P_{MASK\,DATA}$ which comprises a union of polygons. The photomask data set is transferred on to the wafer, to form the pattern $P_{WAFER}$, by a composition of pattern transformations:

$$P_{WAFER} = T_{ETCH}(T_{LITHO}(T_{MASK}(P_{MASK\,DATA}))) \quad (1)$$

$T_{MASK}$ is a transformation that maps the photomask data set to a pattern that is etched into a layer on the photomask. $T_{MASK}$ includes effects of software calculated dose adjustments, electron or laser beam interaction with a e-beam resist or a photoresist on the photomask, resist blur, development of the resist, and etching of the photomask.

$T_{LITHO}$ is a transformation that maps the pattern etched on the photomask to a pattern that is formed in a photoresist layer deposited on a wafer. $T_{LITHO}$ includes the effects of optical image formation, photo-reactions and catalytic reactions in the photoresist, dissolution of the photoresist in a developer solution.

$T_{ETCH}$ is a transformation that maps the pattern that is formed in the photoresist on a wafer to the pattern that is etched in a layer underlying the photoresist. $T_{ETCH}$ includes all steps of the etch process, such as resist-trim and hard-mask-open processes of gate-etch. Gate poly-silicon etch is usually preceded by etching of a silicon dioxide or silicon oxi-nitride hard mask.

Beale et al. (SPIE Vol. 5040, p. 1202-1209, 2003), which is incorporated herein by reference, proposed compensating the photomask data in multiple stages according to:

$$P_{MASKDATA} = T_{MASK}^{-1}(T_{LITHO}^{-1}(T_{ETCH}^{-1}(P_{TARGET}))) \quad (2)$$

In equation (2), $P_{TARGET}$ is the pattern desired on the wafer, $T_{ETCH}^{-1}$ is the inverse of the transformation $T_{ETCH}$, and $T_{LITHO}^{-1}$ is the inverse of the transformation $T_{LITHO}$. The method of Equation (2) is also called multi-step process proximity correction (PPC) (see: Choi et al., Proc SPIE, Vol 5040, p. 1176, 2003, which is incorporated herein by reference). The process is called multi-step or tandem correction because it performs a sequence of inverse transformations. The method first starts with the final target pattern $P_{TARGET}$ and obtains the target for the lithography inversion, which is $T_{ETCH}^{-1}(P_{TARGET})$. It then proceeds to find the target for the mask writing, which is $T_{LITHO}^{-1}(T_{ETCH}^{-1}(P_{TARGET}))$.

According to one approach, both $P_{TARGET}$ and $T_{ETCH}^{-1}(P_{TARGET})$ are represented by a collection of polygons. However, representing $T_{ETCH}^{-1}(P_{TARGET})$ by polygons is counter productive because etch correction results in segmentation and movement of edges of the polygons in $P_{TARGET}$ which results in a lithography target that is not lithography friendly. That is, $T_{ETCH}^{-1}(P_{TARGET})$ obtained using such an approach is not in the range-space of the transformation $T_{LITHO}$. Such an approach runs the risk of creating edge segments that are either too small or not optimal for lithography. It is among the objects of the present invention to address these and other limitations of prior art approaches, and to improve photomask fabrication.

SUMMARY OF THE INVENTION

In accordance with an embodiment of the invention, a method is provided for synthesizing a photomask data set from a given target layout, including the following steps: (a) providing a set of target polygons for the target layout; (b) fitting a smooth curve to a target polygon of said set of target polygons, the curve having a set of etch-target points; (c) moving the etch target points according to a model of an etch process to produce a set of lithography-target points; and (d) synthesizing a photomask data set based on a model of a lithography process and the set of lithography-target points. The steps (b) and (c) are performed for other polygons of said set of polygons. The target region may be applicable to a region of the chip, and the method can be repeated for one or more further regions of the chip. In a preferred embodiment, the smooth curve of step (b) comprises an etch target curve on which said etch target points lie, and the etch target curve substantially matches the target polygon, except at its vertices.

In an embodiment of the invention, the model of an etch process of step (c) is determined by a technique that includes calculating how much of a region above a wafer is visible from a point on the sidewall of an etched feature in the wafer. This step can utilize an algorithm selected from the group consisting of a Overmars-Welzl Algorithm, a Ghosh-Mount Algorithm, and a Lee Algorithm, for constructing a visibility graph in a plane. In a form of this embodiment, the model of an etch process of step (c) is determined by a technique that includes calculating a convolution of a point-spread-function with a photoresist pattern density.

In an embodiment of the invention, the model of an etch process of step (c) has adjustable parameters, and the method further includes the following steps: printing a test pattern in photoresist on a wafer thereby forming a photoresist pattern; measuring critical dimensions of the photoresist pattern; etching a pattern into a layer on a wafer; measuring critical dimensions of the etched pattern; and selecting the adjustable parameters of the model of the etch process according to the measured critical dimensions of the photoresist pattern and the measured critical dimensions of the etched pattern. In this embodiment, the selecting step further comprises substantially minimizing a weighted sum of squares of differences between predictions of the model of the etch process and measured critical dimensions.

In an embodiment of the invention, the step (d) of synthesizing a photomask data set includes: calculating an image intensity at a plurality of lithography target points according to the model of the lithography process; calculating a figure-of-demerit comprising a sum of differences between the calculated image intensities and predetermined values, wherein the sum is evaluated over said plurality of lithography target points; and adjusting the photomask data in a way that decreases the said figure-of-demerit. In a form of this embodiment, the step of calculating a figure-of-demerit further comprises calculating how much a resist edge moves in response to a change in a lithography exposure dose. The calculation of a figure-of-demerit can further comprise calculating how much a resist edge moves in response to a change in a lithography defocus parameter. The step of calculating a figure-of-demerit can further comprise calculating an image slope.

In an embodiment of the invention, the step (d) of synthesizing a photomask data set further comprises calculating edge placement errors at a plurality of lithography target points. In a form of this embodiment, the step of synthesizing a photomask further comprises calculating how much a resist edge is displaced in response to a change in an exposure dose or defocus.

Another embodiment of the invention is a photomask made using the methods of the invention as described herein.

Further features and advantages of the invention will become more readily apparent from the following detailed description when taken in conjunction with the accompanying drawings.

BRIEF DESCRIPTION OF THE DRAWINGS

FIGS. 3.a-3.f show graphs of measurements, and best fitting model, of the difference between line widths after-etch and before-etch, for several different line and space widths.

DETAILED DESCRIPTION

Figure 1:
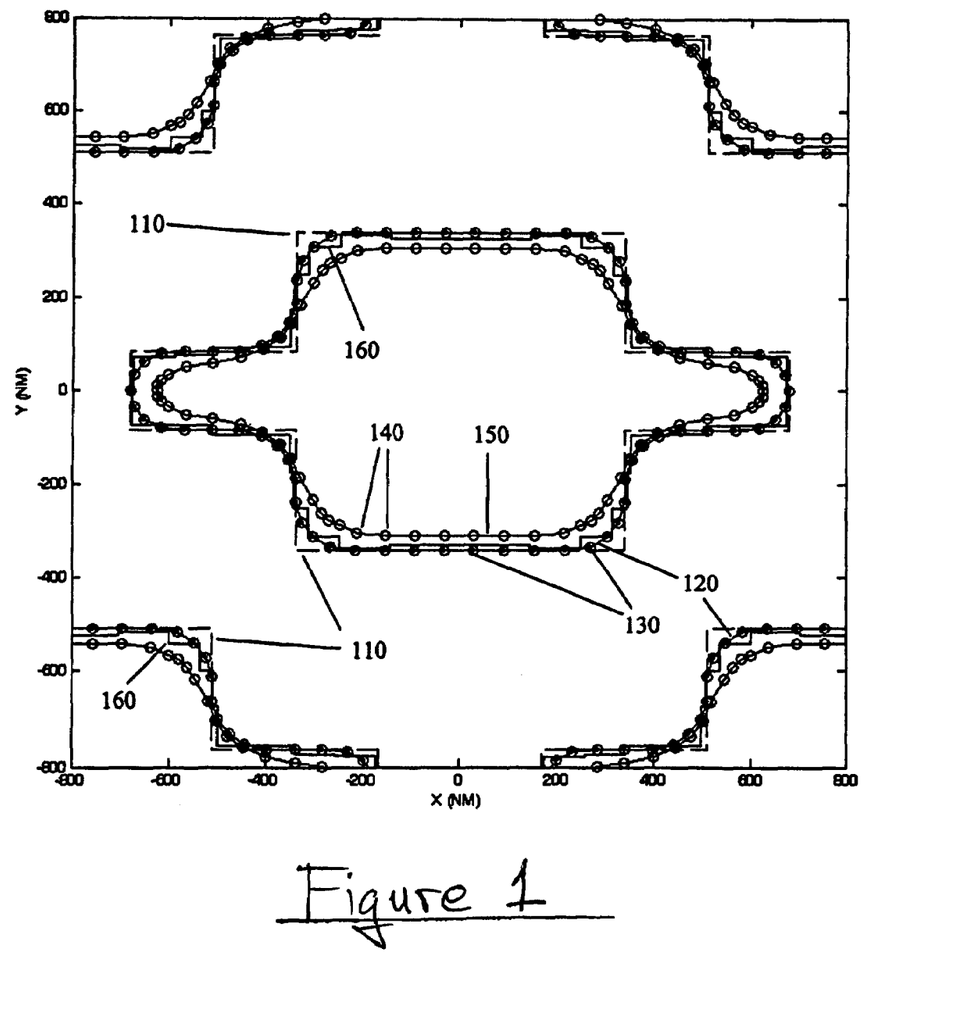
FIG. 1 is a top view of an example showing a target pattern, mask pattern, etch-target curve and lithography-target curve, which are useful in understanding operation of embodiments of the invention.

According to certain embodiments, $T_{ETCH}^{-1}(P_{TARGET})$ is obtained without segmentation or movement of polygons. According to certain embodiments, compensation for the effects of etch and lithography processes comprises the following high-level steps, which are explained in reference to FIG. 1:

A. Providing a model of the etch process; and
B. Obtaining a set of target polygons 110 that make up the target pattern $P_{TARGET}$ which describes the desired pattern to be etched into the wafer; and
C. Approximating polygons 110 in the target pattern $P_{TARGET}$ by etch target curves 120 that have bounded curvature, and that closely match the target polygons except at their vertices; selecting etch target points 130 on the etch target curves 120; and
D. For each etch target point 130, calculating the position of the corresponding litho target point 140, wherein the litho target points lie on smooth litho target curves 150; and
E. Representing the photomask pattern by a set of polygons; and optimizing the polygons by segmenting their edges and moving the segments in a way that places the resist edges on or close to litho target points 140; saving the optimized polygons 160 which make up the photomask data.

These steps are explained in more detail below.

A computational model of the etch process will next be described. Upon etching, the edge of a pattern is displaced in the plane of the wafer, in the direction that is normal (perpendicular) to the edge, by a lateral etch bias ΔEdge, which can be positive or negative. The mathematical model for the lateral etch bias is:

$$\Delta Edge = a_0 + a_{N+1}\Omega_{SKY,h,l} + (\text{resist pattern}) * \sum_{n=1}^{N} \frac{a_n}{2\pi\sigma_n^2}\exp\left(-\frac{x^2+y^2}{2\sigma_n^2}\right) \quad (3a)$$

The term "lateral etch bias," or "etch bias" for short, refers to changes in the dimensions in the plane of the wafer. It is not to be confused with etch depth or a bias in the etch depth. In equation (3a), $\Omega_{SKY,h,l}$ is:

$$\Omega_{SKY,h,l} = \int_{SKY} \cos^l\theta \, d\Omega \quad (3b)$$

$$d\Omega = \frac{\hat{z}\cdot R}{R^3} dxdy$$

$$\cos^l\theta = \left(\frac{\hat{n}\cdot R}{R}\right)^l$$

$$R = (x-x_0, y-y_0, h)$$

$$R = \sqrt{R\cdot R}$$

Figure 2:
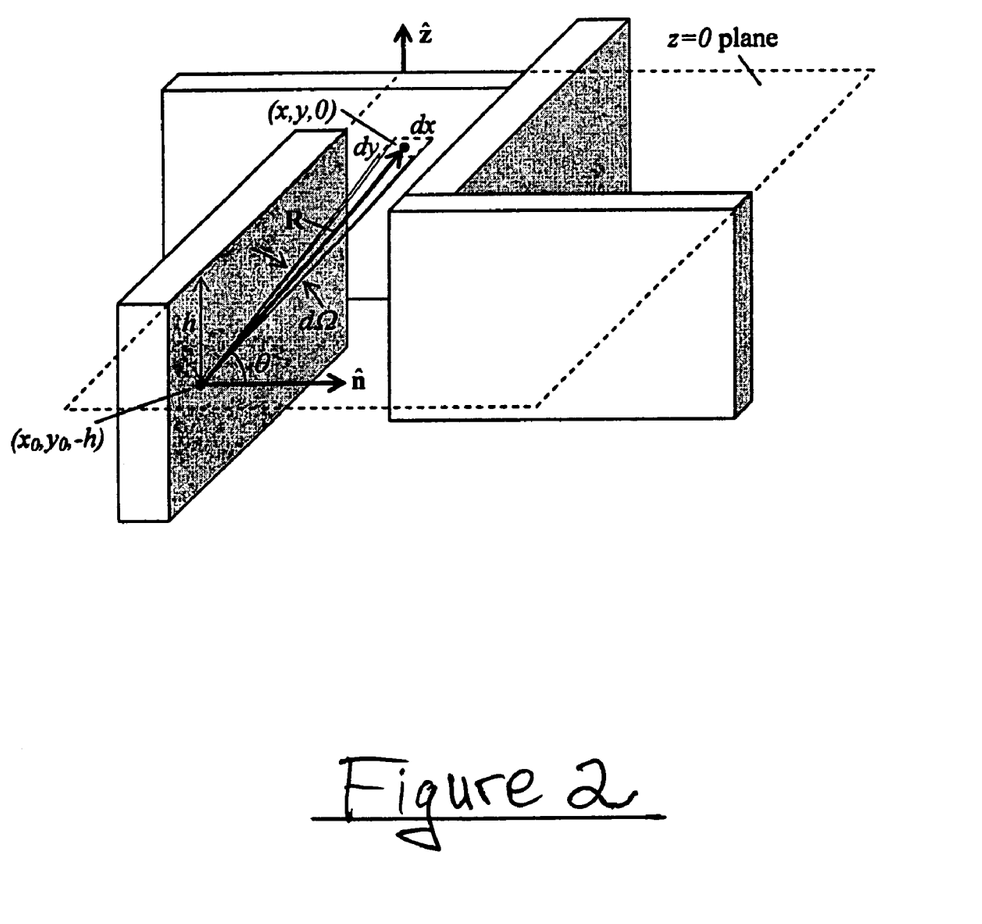
FIG. 2 is a three dimensional oblique view of a pattern that is being etched, that useful in understanding a feature of embodiments of the invention.

$\Omega_{SKY,h,l}$ is specific to a pattern, and to an observation point $(x_0, y_0, -h)$ on a sidewall of a pattern that is being etched. According to this model, the pattern that is being etched, like a well-trimmed maze, has a planar top and vertical side-walls, as illustrated in FIG. 2. We designate the top plane as the z=0 plane. The observation point is a distance h below the z=0 plane. The integration point (x, y, 0) is on the top (z=0) plane. The vector R from the observation point $(x_0, y_0, -h)$ to the integration point (x, y, 0) does not intersect any sidewalls. In other words, there is an unobstructed view of the sky (the plasma) from the observation point $(x_0, y_0, -h)$ looking in the direction of the integration point (x, y, 0). The domain of the 2-dimensional integral in Equation (3b), labeled "SKY," is the set of such points (x, y, 0) on the plane. The infinitesimal solid angle dΩ is the solid angle subtended at the observation point $(x_0, y_0, -h)$ by the area element dxdy on the integration plane. In (3b), ẑ is the unit vector along the z-axis, which is perpendicular to the plane of the wafer; n̂ is the outward unit normal vector that is perpendicular to the side wall at the observation point $(x_0, y_0, -h)$; and θ is the angle between the vector R and the unit normal n̂. Assuming the sidewall is impacted by plasma particles originating above the plane z=0, and that are equally likely to travel in any direction, the rate of particles that impact per unit area of the sidewall is proportional to $\Omega_{SKY,h,l}$ at the observation point $(x_0, y_0, -h)$ when l=1. In the preferred embodiment, the value of the exponent l is unity. In another embodiment, where the outcome of an impact on the sidewall depends on the angle of incidence θ, the value of the exponent l is greater than one. In another embodiment, the value of the exponent l is 0, in which case, $\Omega_{SKY,h,0}$ is the solid angle that subtends the visible part of the sky (plasma above the wafer) from the observation point.

Similarly, reaction products that are formed at the bottom (floor) of trenches that are being etched can sputter on to the sidewalls and form a polymer that protects the sidewall from further etching. The rate of such sputtering is governed by a similar "solid angle of the floor." The term $\alpha_{N+1}\Omega_{SKY}$ is intended to approximately account for the combined effect of the plasma particles incident from the sky and the polymer deposition by particles sputtered from the floor. In an embodiment hereof, Equation (3a) is used. In a preferred embodiment, the depth parameter h is adjusted by fitting the predictions of the model to measured etch biases. Alternatively, the depth h can be set to be a fixed fraction of the etch depth, such as half of the etch depth.

The function (resist pattern) (x,y) in Equation (3a) takes the value 1 where there is resist on the wafer, and 0 where the resist has been removed. The symbol * indicates two-dimensional convolution. The two-dimensional convolution is evaluated at the point $(x_0, y_0)$. The summation on the right-hand-side of Equation (3) is a point-spread-function that accounts for pattern density effects in etching the wafer. Changes in the pattern density affect the rate at which reactants are consumed and reaction products are generated. Local variations in the densities of reactants and reaction products are partially equalized by diffusion processes which are not instantaneous. The point-spread-function is a linear superposition of Gaussians with length parameters $\sigma_1$, $\sigma_2, \ldots, \sigma_N$, which describes a combination of diffusion processes with various diffusion rates. According to certain embodiments, $\sigma_1, \sigma_2, \ldots, \sigma_N$ are assigned logarithmically spaced values between the minimum and maximum diffusion lengths that can be probed by the test patterns that are used to calibrate the etch model. In an alternative embodiment, the parameters $\sigma_1, \sigma_2, \ldots, \sigma_N$ are determined by minimizing the difference between predictions of the model and measured etch biases of test patterns. The amplitudes, or coefficients, $\alpha_0, \alpha_1, \alpha_2 1, \ldots, \alpha_{N+1}$ are adjustable, and a priori unknown, parameters of the etch model. The coefficient $\alpha_{N+1}$ is the weight of the solid angle term, which accounts for deposition or ablation of material on the sidewall. Each of the coefficients $\alpha_0, \alpha_1, \alpha_2, \ldots, \alpha_{N+1}$ can be positive or negative. The coefficient $\alpha_0$ represents a constant etch bias.

In an embodiment of the invention, Equation (3a) indicates the rate of lateral etch at an instance. The shape of the etched pattern evolves with time. The parameters in Equation (3a), such as the depth parameter, h, are time dependent. As the pattern is etched, the right-hand-side of Equation (3a) is updated and the evolution of the etch pattern is calculated by time-stepping.

In a preferred embodiment, the lateral etch is evaluated in one step, wherein the parameters on the right-hand-side of Equation (3a) represent the geometry of the resist pattern. This embodiment facilitates fast calculation of the etched pattern given the resist pattern.

In another preferred embodiment, the lateral etch is evaluated in one step, where the parameters on the right-hand-side of Equation (3a) represent the geometry of the final etched pattern. This embodiment facilitates fast calculation of the resist pattern before etching, given the final etch pattern.

Calibration of the etch model will next be described. A multitude of test patterns are printed on a wafer to calibrate the etch model. According to certain embodiments, the test patterns include line gratings. Dimensions of the photoresist pattern on the wafer are measured by electron microscopy (CD-SEM), or atomic force microscopy, or optical scatterometry. Then, the wafer is etched following the same etch process that will be used in the manufacturing of a semiconductor device. The dimensions of the etched patterns are measured. CD-SEM measurements on photoresist patterns shrink the photoresist. Therefore, the before-etch and after-etch CD-SEM measurements are not taken at the same wafer-coordinates. Identical copies of each test pattern are provided in close proximity to each other, such as less than 1 mm distance. A test pattern is used for the before-etch measurement. A twin of the same test pattern is used for the corresponding after-etch measurement.

The etch bias ΔEdge is calculated from the difference of the resist and post-etch measurements. For example, for line gratings:

$$\Delta \text{Edge} = (CD_{ETCH} - CD_{LITHO})/2 \quad (4)$$

$CD_{LITHO}$ and $CD_{ETCH}$ are dimensions of the same feature in a test pattern before and after etching, respectively. They are also know as the develop inspection (DI) and final inspection (FI) critical dimensions, respectively. The parameters $\alpha_0, \alpha_1, \alpha_2, \ldots, \alpha_{N+1}$ of the model are obtained from ΔEdge for a plurality of test targets with various line and space widths. The parameters $\alpha_0, \alpha_1, \alpha_2, \ldots, \alpha_{N+1}$ are obtained by linear regression, i.e., by solving a system of linear equations in the least-squares sense. For line-space targets, the linear system of equations is as follows:

$$\Delta Edge_m = a_0 + \sum_{n=1}^{N}(A_{mn} a_n) + a_{N+1}\Omega_m; m = 1, \ldots, M \quad (5)$$

In Equation (5), the index m labels a multitude of line grating test targets. Each line grating has different combination of line and space widths. The parameters of the line gratings are as follows:

$K_{m,1} + K_{m,2} + 1$ = number of lines in the $m^{th}$ line grating target $K_{m,1} + 1$ = line number in the $m^{th}$ grating on which the measurement is taken $L_m$ = line width in the $m^{th}$ line grating target (6)

$S_m$ = space width in the $m^{th}$ line grating target $P_m = L_m + S_m$ = pitch of the $m^{th}$ line grating target (6)

The first N coefficients in Equation (5) are convolutions of Gaussian kernels with the line grating:

$$A_{mn} = \frac{1}{2} \sum_{k=-K_{m,1}}^{K_{m,2}} \left( \text{erf}\left(\frac{kP_m + L_m}{\sqrt{2}\,\sigma_n}\right) - \text{erf}\left(\frac{kP_m}{\sqrt{2}\,\sigma_n}\right) \right) \quad (7)$$

$\sigma_n = n^{th}$ Gaussian length parameter $$\text{erf}(z) = \frac{2}{\sqrt{\pi}} \int_0^z e^{-t^2} dt$$

The last term in Equation (5) is the solid angle of the sky seen from a point on the side wall of the $K_{m,1}+1^{st}$ line in the $m^{th}$ line grating target, a distance h from the top of the line (for l=0):

$$\Omega_m = \int_{-\pi/2}^{\pi/2} d\phi \int_0^{S_m \sec\phi} \frac{hr\,dr}{(h^2+r^2)^{3/2}} = \pi - 2\sin^{-1}\frac{h}{\sqrt{h^2+S_m^2}} \quad (8)$$

h = vertical distance from the top of the line to an observation point on the edge of the line.

Figure 3:
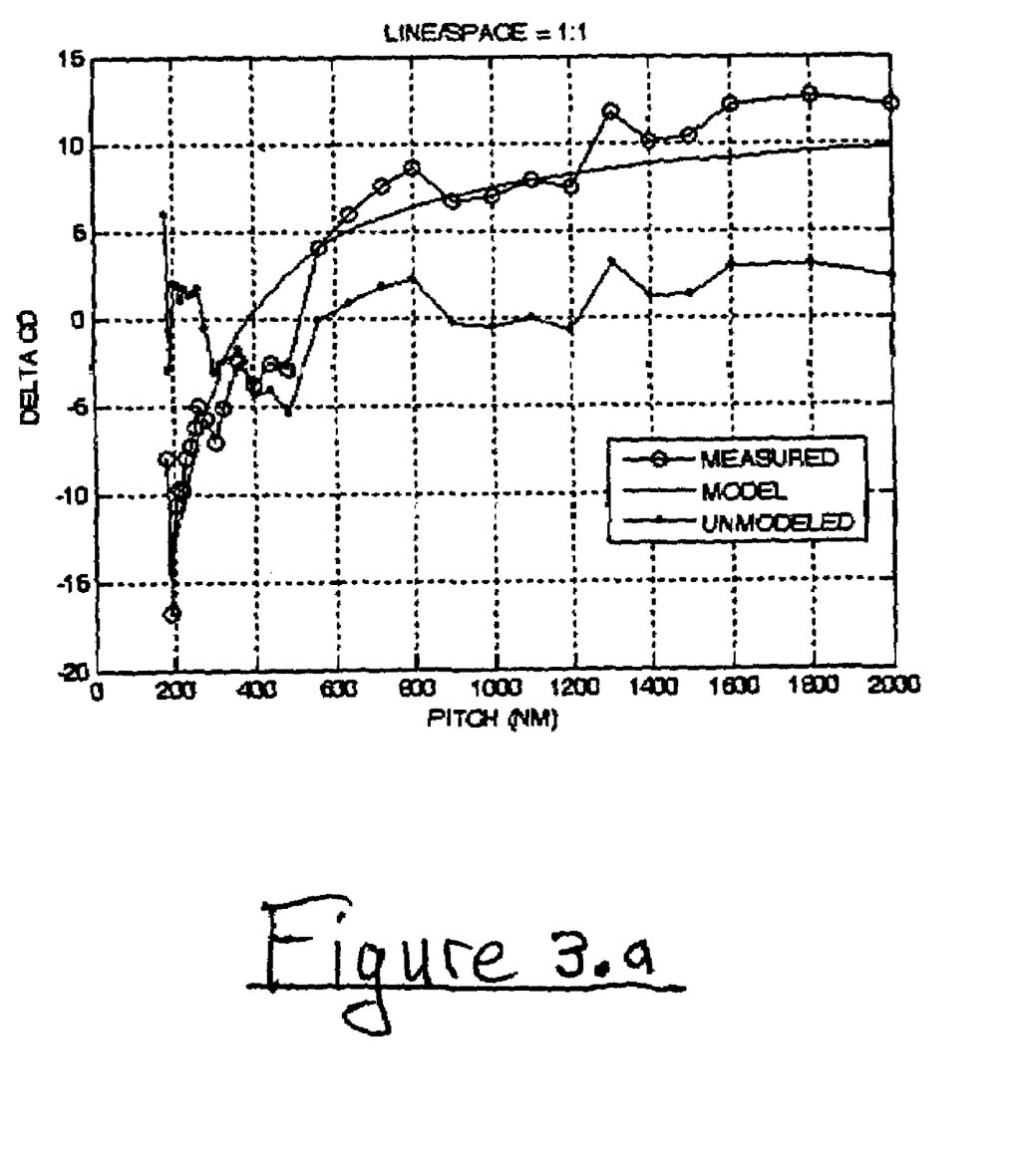

FIGS. 3.a-3.f show measured etch biases that make up the calibration data; the etch biases calculated according to the best fitting model; and the differences between the measurements and the model, which are labeled "un-modeled." The horizontal axes indicate pitches (line width+space width) of line gratings. Each point on these figures corresponds to a line grating having a distinct combination of line and space widths. The measurements in FIGS. 3.*a*-3.*c* are widths of lines. The measurements in FIGS. 3.*d*-3.*f* are widths of spaces. Spaces are regions that are etched and lines are regions that are protected by a photoresist. Model parameters were determined by fitting the model to 169 measured etch biases in the least-squares sense. That is, the model parameters minimize the sum of squares of fit errors over 169 test patterns. In this example, the line gratings were printed using a lithography projector with a 193 nm exposure wavelength and a numerical aperture of NA=0.75. The layer that is etched is a poly-silicon gate layer with a hard mask. The hard mask and the poly-silicon are etched with two separate etch processes. The model is fitted to the final result etched in poly-silicon.

Once equation (5) is solved, the model is calibrated and it can be used to predict etch bias of arbitrary 2-dimensional patterns. According to certain embodiments, the model is verified on one-dimensional and two-dimensional test patterns that were not used to calibrate the model. Verification is done by recording CD-SEM images or CD measurements of the verification pattern before and after etching, and comparing the etch bias to the predictions of the model.

In another embodiment of the invention, the model parameters are calibrated using measurements taken on before-etch and after-etch measurements on test targets that comprise any combination of: lines-and-spaces, dots (posts) of various diameters, holes of various diameters, end of a line, end of a slot (trench), an array of line-ends, an array of slot-ends, bending lines, bending trenches.

The target layout is generated by circuit layout, routing, timing, and possibly, manufacturability considerations. The target layout is described by the union of a set of polygons. The polygons are typically specified by the coordinates of their vertices and stored in a file in GDSII or OASIS format. The target layout is input to the method of the invention as described herein.

Figure 4:
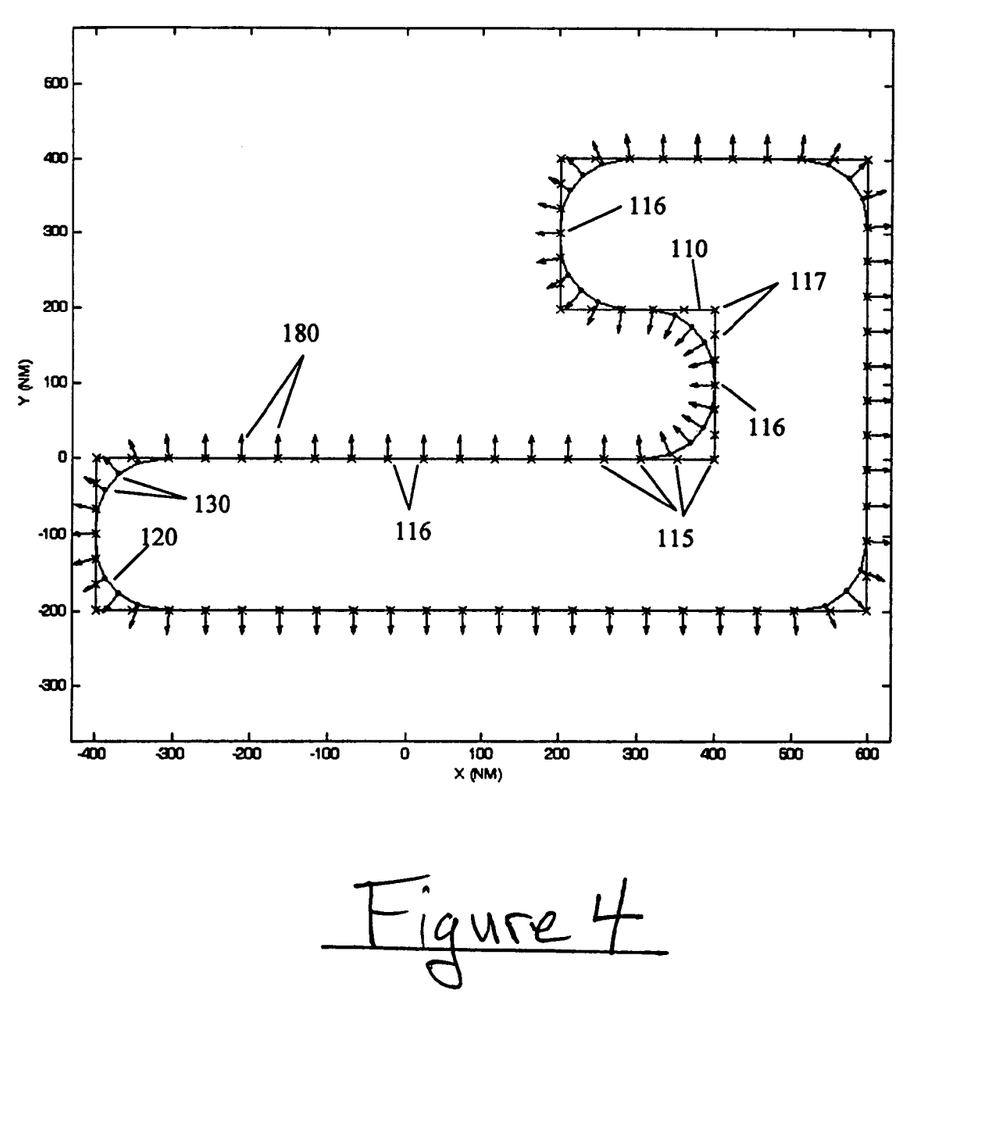
FIG. 4 is a plan view of a target polygon, a realizable etch-target curve derived from the target polygon, and its normal vectors, which is useful in understanding operation of embodiments of the invention.

The generation of etch target points will next be described. Target polygons most commonly have 90° angles, in some cases 135° angles, at their vertices. Other angles, especially acute angles, are less common but possible. Such sharp corners are impossible to produce reliably with a combination of photolithography and etching. According to certain embodiments hereof the corners of the target polygons are rounded to render them realizable. A practical advantage of rounding corners is: the direction that is perpendicular to the edge of a polygon is not well defined at the vertices of a polygon, but the normal direction is always unambiguous for a smooth closed curve that doesn't intersect itself. There are many ways of rounding the corners of a polygon: one approach is to replace the corners of the polygon with segments of circles or ellipses that are tangent to the edges of the polygon. A preferred embodiment of generating etch target points comprises the following steps which are explained with reference to FIG. 4:

1. Merging overlapping target polygons to form a set of non-overlapping polygons 110; and
2. Placing points 115 on the edges of a polygon in the set of non-overlapping polygons 110. These points are labelled: $p_1, p_2, \ldots, p_N$ sequentially, traveling in the counter-clockwise direction around the polygon. Some of these points may be placed on the vertices of the polygon. The distance between adjacent points is preferably less than $0.25\,\lambda/NA$, where $\lambda$ and NA are, respectively, the exposure wavelength and numerical aperture of the lithography projector. This measure is taken because according to certain embodiments the etch target points evolve into the lithography target points. The intensity of the lithography image is band-limited in the spatial-frequency domain with a Nyquist sampling rate of $0.25\,\lambda/NA$.
3. Classifying each target point into one of a multitude of categories such as: points 116 that should not move (these are points at the center of a line-end and points that are away from any vertex); and points 117 that will evolve (these are points in the vicinity of at least one vertex). Points that will evolve are optionally further classified into classes such as: 90° or 135°, inner or outer corners; points on a small jog; and points on a Z-bend. An achievable curvature is assigned to each class.
4. Assigning an achievable curvature for each moveable point $p_n$ according to its class; and
5. Recursively evolving each movable point according to:

$$p_n^{(k+1)} = (1-t_n^k)p_n^{(k)} + t_n^k(p_{n-1}^{(k)} + p_{n+1}^{(k)})/2.$$

The superscript (k) indicates the recursion or iteration number, or equivalently, time-index in the time-evolution. The subscript n sequentially labels the points around the target polygon. The evolution (displacement) is calculated for each of the points $p_1, p_2, \ldots, p_N$ on a polygon, each point $p_n^{(k)}$ is moved to its new location $p_n^{(k+1)}$, and the recursion is repeated. The parameter $0 \leq t_n^k \leq 1$ is between zero and one, and it can be different for each point and at each iteration. The parameter $t_n^k$ increases with increasing curvature at point $p_n^{(k)}$. The larger the parameter $t_n^k$, the faster point $p_n^{(k)}$ moves. Keeping $t_n^k$ bounded from above by 1 ensures that a target curve does not intersect itself as it evolves. If the curvature at $p_n^{(k)}$ drops below its assigned achievable curvature, $t_n^k$ is set to zero, which halts the evolution of the target curve at that location. FIG. 4 shows the initial points 115 and the points 130 at the final iteration. For clarity, points at intermediate iterations are not shown.

6. Optionally deleting one of the adjacent points, or replacing two adjacent points with their midpoint, if the distance between adjacent points falls below a preset value. The purpose of this is to eliminate redundant target points, since all computations to follow take a time that is proportional to the number of target points.
7. Repeating steps 5 and 6 until the curvature at each remaining etch-target point is less than or equal to its achievable curvature.

This method replaces a target polygon 110 with a set of etch-target points 130 that lie on a smooth curve 120. The smooth curve 120 is not explicitly defined but it is represented by points $p_1^{(K)}, p_2^{(K)}, \ldots$ (130 in FIG. 1) where the superscript (K) refers to the final step of the above time-evolution. Since we do not describe all points on the smooth curve 120, one might question the distinction of a polygon and a set of points $p_1^{(K)}, p_2^{(K)}, \ldots, p_N^{(K)}$ describing a smooth curve. The distinction is: the absolute value of the angle between the vector $p_{n-1}^{(K)} p_n^{(K)}$ and the vector $p_n^{(K)} p_{n+1}^{(K)}$ is substantially less than 45° for all etch target points 130 on the curve 120. This is not true for polygons in a circuit layout or polygons that comprise a photomask data set. When it is said that a subset of etch target points or lithography target points $p_1^{(K)}, p_2^{(K)}, \ldots, p_N^{(K)}$ describe a smooth curve, it is meant that the angle between the vector $p_{n-1}^{(K)} p_n^{(K)}$ and the vector $p_n^{(K)} p_{n+1}^{(K)}$ is substantially less than 45° for each point $p_n^{(K)}$ in the subset. A closed, smooth curve can be fitted to the target points $p_1^{(K)}, p_2^{(K)}, \ldots, p_N^{(K)}$ that belong to a polygon 110, such that the smooth curve does not substantially deviate from the line segments that join adjacent target points (line segments: $p_1^{(K)} p_2^{(K)}; p_2^{(K)} p_3^{(K)}, \ldots, p_{N-1}^{(K)} p_N^{(K)}; p_N^{(K)} p_1^{(K)}$).

What is meant by curvature of the smooth curve at a point p on the curve is that the magnitude of the vector $d^2p(s)/(ds)^2$ where p(s) is the parametric representation of a point on the curve, wherein the parameter s is the path length along the curve measured from an arbitrary point on the curve. In practice, since we only have a set of points $p_1, p_2, \ldots, p_N$ on the smooth curve, we numerically calculate the curvature at $p_n$ according to:

$$curvature_n = 2 \frac{\|p_{n-1} - p_n\|p_{n+1} + \|p_{n+1} - p_n\|p_{n-1} - (\|p_{n-1} - p_n\| + \|p_{n+1} - p_m\|)p_n}{\|p_{n-1} - p_n\|\|p_{n+1} - p_n\|(\|p_{n-1} - p_n\| + \|p_{n+1} - p_m\|)} \quad (9)$$

In this description, $p_n$ refers to one of many points on a curve that are sequentially labeled. The points $p_{n-1}$ and $p_{n+1}$ are adjacent to $p_n$. It is understood that $p_{n+1}$ stands for $p_1$ if n=N is the last point. Similarly, $p_{n-1}$ is understood to stand for $p_N$ if n=1 is the first point.

The obtaining of litho target points from etch target points will next be described. Etch target points 130 are selected on etch target curves 120. The outward unit normal $\vec{n}$ of each curve is calculated at each target point 130. The outward normal vector (180 in FIG. 4) of a smooth curve p(s) in the xy-plane, parametrized by its path length s, is:

$$\vec{n}(s) = \frac{dp(s)}{ds} \times \hat{z} \quad (10)$$

The unit vector $\hat{z}$ is normal to the plane of the wafer. The normal vector $\vec{n}_m$ at a point $p_m$ on a smooth, closed curve that passes through the points $p_1, p_2, \ldots, p_N$ is numerically calculated as follows:

$$\vec{n}_m = \frac{\|p_{m-1} - p_m\|^2 p_{m+1} - \|p_{m+1} - p_m\|^2 p_{m-1} + (\|p_{m+1} - p_m\|^2 - \|p_{m-1} - p_m\|^2)p_m}{\|p_{m-1} - p_m\|\|p_{m+1} - p_m\|(\|p_{m-1} - p_m\| + \|p_{m+1} - p_m\|)} \quad (11)$$

The litho target point 140 corresponding to an etch target point 130 is found by moving from the etch target by $-\vec{n}\Delta Edge$, wherein $\Delta Edge$ is the etch bias calculated by the etch model. The solid angle and the convolutions in (3a) are calculated for the pattern defined by the etch target points.

The calculation of $\Omega_{SKY,h,l}$, which is one of the terms that make up $\Delta Edge$, requires identifying the integration domain "SKY" in the integration (3.b). The integration domain, which is specific to a target point, is the set of points (x,y,0) such that, the ray starting from the target point $(x_0, y_0, -h)$ and going through a point (x, y,0) in the integration domain reaches the sky (plasma) without intersecting the 3-dimensional pattern that is being etched. Identifying the integration domain, which is a subset of the z=0 plane, is closely related to the problem of determining the visibility map of a set of non-intersecting line segments in the plane. The top-view of the etched pattern, i.e. the two dimensional etch-target curve in the plane of the wafer, is a set of polygons in the plane. An etch target point, or the projection of $(x_0, y_0, -h)$ on to the z=0 plane, is a point on the etch-target curve. The visibility map of the etch-target curves (polygons) is determined by the Overmars-Welzi algorithm (see: Overmars, M. H. and E. Welzl, Construction of Sparse Visibility Graphs, Technical Report RUU-CS-87-9, Department of Computer Science, University of Utrecht, 1987) in a preferred embodiment. In other embodiments, the visibility map is determined by either one of: Ghosh-Mount algorithm (Ghosh, S. K. and D. M. Mount, "An Output Sensitive Algorithm For Computing Visibility Graphs," SIAM J. Comput. Vol. 20, No. 5, pp. 888-910, October 1991), Lee Algorithm (Lee, D. T., "Proximity And Reachability In The Plane," Ph.D. Thesis and Tech Report ACT-12, Coordinated Science Laboratory, Univerity of Illinois at Urbana-Champaign, Urbana, Ill., 1978), or the so-called Naïve-Algorithm (Kitzinger, J., "The Visibility Graph Among Obstacles: A Comparison Of Algorithms," M. S. Thesis, Department of Computer Science, University of Mexico, 2003). For each target point, the integration domain is divided up into triangles where one vertex of each triangle is the target point. The integral $\Omega_{SKY,h,l}$ is then analytically calculated over each triangle.

The corresponding litho target point 140 is displaced by $-\vec{n}\Delta Edge$ from 130 where $\Delta Edge$ is the etch bias calculated by the etch model. The reasoning behind this correction is that:

$$T_{ETCH}^{-1} = (I+E)^{-1} \cong I-E \quad (12)$$

If etch transformation amounts to a small perturbation E on the identity map I, then its inverse can be approximated by I-E. A more accurate approximation to $T_{ETCH}^{-1}$ can be obtained by iterating the etch correction, i.e., using a series expansion in (12). Alternatively, $T_{ETCH}^{-1}$ can be calculated by solving a minimization problem:

$$\min_{P_{LITHO}} \|T_{ETCH}(P_{LITHO}) - P_{ETCH}\| \quad (13)$$

where $P_{LITHO}$ is the pattern defined by litho target points 140, and $P_{ETCH}$ is the pattern defined by etch target points 130. The norm of difference between two patterns can be the square root of the sum of squares of distances between points 130, and the corresponding points predicted by the etch model $T_{ETCH}(P_{LITHO})$.

The photomask data synthesis will next be described. The litho target points 140 are used to express the optimization goals of for the optimization process that implements $T_{LITHO}^{-1}$. For details of this calculation, see, for example, the following copending U.S. patent applications, which are all assigned to the same assignee as the present application: U.S. patent application Ser. No. 11/203,498, filed 13 Aug. 2005; U.S. patent application Ser. No. 11/203,505, filed 13 Aug. 2005; U.S. patent application Ser. No. 11/203,330, filed 13 Aug. 2005; and U.S. patent application Ser. No. 11/203,329, filed 13 Aug. 2005, all incorporated herein by reference.

According to certain embodiments, the mask data comprises a set of polygons whose edges are parallel to the x, y, x+y, or x-y axes. This is because mask writers, and the software that handle the data for mask writers, work most efficiently under these conditions. The polygons in the mask data set are optimized by segmenting their edges and moving (displacing) the segments is a way that preserves their angular orientation. According to certain embodiments, there is no pairing of edge segments of a polygon and the target points. The edge segments in the mask are adjustable, or independent, variables of optimization. The target points are used to define the optimization goal. For example, the optimization in an embodiment minimizes a figure of demerit $F_1 m$ of the photomask data m:

$$F_1 m = \sum_{q=1}^{Q} \sum_{j=1}^{M} (I(x_j, y_j; z_q) - t)^2 \quad (14)$$

In Equation (14), $I(x_j, y_j; z_q)$ denotes a lithographic latent image intensity at the location $(x_j, y_j)$ in the wafer-plane when the defocus is $z_q$. The defocus refers to the axial displacement of the wafer from a position of best focus. The symbol t denotes a threshold, which is equal to the ratio: (dose-to-clear/dose) where "dose" refers to the light exposure dose (energy per unit area) applied to a photoresist, and "dose-to-clear" indicates the minimum dose necessary to clear a positive photoresist or not clear a negative photoresist. A positive photoresist dissolves if $I(x_j, y_j; z_q) > t$, and it does not dissolve if $I(x_j, y_j; z_q) < t$, at the location $(x_j, y_j)$ in the wafer-plane when the defocus is $z_q$. The inequalities are reversed for a negative photoresist. The point $(x_j, y_j)$ is the $i^{th}$ litho target point, one of the points 140 in FIG. 1. Since the squared terms in Equation 11 are summed over target points and focus values, resist edges go through all M target points, for all Q focus values if and only if $F_1 m = 0$. In practice, $F_1 m = 0$ is not feasible; therefore the photomask is designed by minimizing $F_1 m$. This description embodies the special case Q=1 where Equation (14) is evaluated for a single focus value, such as the best focus, z=0. Using a single focus value reduces the computation time.

Alternatively, the photomask data can be designed by minimizing a figure-of-demerit $F_2 m$ of the photomask data set m:

$$F_2 m = \sum_{q=1}^{Q} \sum_{j=1}^{M} \frac{(I(x_j, y_j; z_q) - t)^2 + \alpha}{\left(tol_j \frac{\partial I}{\partial n}(x_j, y_j; z_q)\right)^2} \quad (15)$$

Minimizing $F_2 m$ forces the resist edge to go through the litho target points $(x_j, y_j)$; j=1, . . . , M for focus values $z_1, \ldots, z_Q$. The image-slope $$\frac{\partial I}{\partial n}(x_j, y_j; z_q)$$

is the directional derivative of the image in the direction that is perpendicular to the target edge (150 in FIG. 1). The following term is a first-order estimate of the edge-placement error (EPE):

$$EPE_{j,q} \equiv \text{Edge placement error at } (x_j, y_j; z_q) \quad (16)$$

$$= \frac{I(x_j, y_j; z_q) - t}{\frac{\partial I}{\partial n}(x_j, y_j; z_q)}$$

The edge placement error is normalized with the edge placement tolerance $tol_j$ for the $j^{th}$ target point:

$$\text{Relative edge placement error at }(x_j, y_j; z_q) = \frac{I(x_j, y_j; z_q) - t}{tol_j \frac{\partial I}{\partial n}(x_j, y_j; z_q)} \quad (17)$$

Edge placement error depends on the exposure dose. If the exposure dose is increased by $\Delta dose$, such that $\Delta dose/dose \ll 1$, then the edge placement error changes as follows:

$$EPE_{j,q}(\Delta dose) = \frac{I(x_j, y_j; z_q) - \left(1 - \frac{\Delta dose}{dose}\right)t}{\frac{\partial I}{\partial n}(x_j, y_j; z_q)} \quad (18)$$

If the sum of $\lfloor EPE_{jq}^2(+\Delta dose) + EPE_{jq}^2(-\Delta dose) \rfloor / tol_j^2$ over all target points is minimized, then the figure-of-demerit $F_2 m$ in Equation (15) is derived as follows:

$$F_2 m = \sum_{q=1}^{Q} \sum_{j=1}^{M} \frac{(I(x_j, y_j; z_q) - t)^2 + \left(\frac{\Delta dose}{dose} t\right)^2}{\left(tol_j \frac{\partial I}{\partial n}(x_j, y_j; z_q)\right)^2} \quad (19)$$

This determines the value of the parameter $\alpha$ as:

$$\alpha = \left(\frac{\Delta dose}{dose} t\right)^2 \quad (20)$$

As an alternative approach, the figure-of-demerit $F_2 m$ in Equation 15 is derived by introducing edge-displacement (ED) induced by dose-variation:

$$ED_{j,q}(\Delta dose) \equiv \text{Edge displacement induced by} \quad (21)$$

$$\text{dose variation at } (x_j, y_j; z_q)$$

$$= \frac{\frac{\Delta dose}{dose} t}{\frac{\partial I}{\partial n}(x_j, y_j; z_q)}$$

If the sum of $\lfloor EPE_{jq}^2 + ED_{jq}^2(\Delta dose) \rfloor / tol_j^2$ over all target points is minimized, then again the figure-of-demerit $F_2 m$ in Equation (15) is derived, with the value of the parameter $\alpha$ given by Equation (17).

In order to minimize the figure-of-demerit (14), the litho target points 140 are needed. To minimize the figure-of-demerit (15), the litho target points and unit normal vectors (unit vectors in the plane of the wafer, and that are perpendicular to a smooth curve 150 that goes through the litho target points) at the litho target points are needed. Most notably, a polygonal litho target is not needed; and there is no need to segment a polygonal litho target.

According to certain embodiments, there is a photomask data set that comprises polygons. The method starts with an initial guess of the photomask data set. The polygons in the photomask data set are segmented and the positions of the segments are optimized to minimize a figure-of-demerit such as (14) or (15). The figure-of-demerit is expressed in terms of some quality of the lithographic image at the litho target points. There is no pairing, or one-to-one correspondence, of the litho target points and the segments of the polygons comprising the photomask data set.

In the foregoing specification, embodiments of the invention have been described with reference to numerous specific details that may vary from implementation to implementation. The specification and drawings are, accordingly, to be regarded in an illustrative rather than a restrictive sense.

The invention claimed is:

1. A method of synthesizing a photomask data set from a given target layout, comprising the steps of:
   a) providing a set of target polygons for said target layout;
   b) fitting a smooth curve to a target polygon of said set of target polygons by a computer, the curve having a set of etch-target points;
   c) moving the etch target points according to a model of an etch process to produce a set of lithography-target points, wherein said model of an etch process comprises calculating how much of a region above a wafer is visible from a point on the sidewall of an etched feature in the wafer; and
   d) synthesizing a photomask data set based on a model of a lithography process and the set of lithography-target points.

2. The method as defined by claim 1, wherein said target layout is applicable to a region of a chip, and further compromising repeating the method for at least one further region of the chip.

3. The method as defined by claim 1, wherein said steps (b) and (c) are performed for other polygons of said set of polygons.

4. The method as defined by claim 3, wherein said model of an etch process of step (c) has adjustable parameters, the method further comprising:
   printing a test pattern in photoresist on a wafer thereby forming a photoresist pattern;
   measuring critical dimensions of the photoresist pattern;
   etching a pattern into a layer on a wafer;
   measuring critical dimensions of the etched pattern; and
   selecting the adjustable parameters of the model of the etch process according to the measured critical dimensions of the photoresist pattern and the measured critical dimensions of the etched pattern.

5. The method as defined by claim 1, wherein said smooth curve of step (b) substantially matches the target polygon, except at its vertices.

6. The method as defined by claim 5, wherein said smooth curve of step (b) comprises an etch target curve on which said etch target points lie.

7. The method as defined by claim 1, wherein said model of an etch process of step (c) comprises calculating a convolution of a point-spread-function with a photoresist pattern density.

8. The method as defined by claim 1, wherein said model of an etch process of step (c) has adjustable parameters, the method further comprising:
   printing a test pattern in photoresist on a wafer thereby forming a photoresist pattern;
   measuring critical dimensions of the photoresist pattern;
   etching a pattern into a layer on a wafer;
   measuring critical dimensions of the etched pattern; and
   selecting the adjustable parameters of the model of the etch process according to the measured critical dimensions of the photoresist pattern and the measured critical dimensions of the etched pattern.

9. The method as defined by claim 8, wherein said selecting step further comprises substantially minimizing a weighted sum of squares of differences between predictions of the model of the etch process and measured critical dimensions.

10. A photomask made using the method defined by claim 8.

11. The method as defined by claim 1, wherein said step (d) of synthesizing a photomask data set further comprises calculating edge placement errors at a plurality of lithography target points.

12. The method as defined by claim 11, wherein said step of synthesizing a photomask further comprises calculating how much a resist edge is displaced in response to a change in an exposure dose or defocus.

13. The method as defined by claim 1, wherein said step (c) utilizes an algorithm selected from the group consisting of a Overmars-Welzl Algorithm, a Ghosh-Mount Algorithm, and a Lee Algorithm, for constructing a visibility graph in a plane.

14. A photomask made using the method defined by claim 1.

15. A method of synthesizing a photomask data set from a given target layout, comprising the steps of:
   a) providing a set of target polygons for said target layout;
   b) fitting a smooth curve to a target polygon of said set of target polygons by a computer, the curve having a set of etch-target points;
   c) moving the etch target points according to a model of an etch process to produce a set of lithography-target points; and
   d) synthesizing a photomask data set based on a model of a lithography process and the set of lithography-target points and wherein synthesizing a photomask data set further comprises:
      calculating an image intensity at a plurality of lithography target points according to the model of the lithography process;
      calculating a figure-of-demerit comprising a sum of differences between the calculated image intensities and predetermined values, wherein the sum is evaluated over said plurality of lithography target points; and
      adjusting the photomask data in a way that decreases the said figure-of-demerit.

16. The method as defined by claim 15, wherein said step of calculating a figure-of-demerit further comprises calculating how much a resist edge moves in response to a change in a lithography exposure dose.

17. The method as defined by claim 15, wherein said step of calculating a figure-of-demerit further comprises calculating how much a resist edge moves in response to a change in a lithography defocus parameter.

18. The method as defined by claim 15, wherein said step of calculating a figure-of-demerit further comprises calculating an image slope.

19. A photomask made using the method defined by claim 15.

20. A method of synthesizing a photomask data set from a given target layout, comprising the steps of:
   a) providing a set of target polygons for said target layout;
   b) fitting a smooth curve to a target polygon of said set of target polygons by a computer, the curve having a set of etch-target points;
   c) moving the etch target points according to a model of an etch process to produce a set of lithography-target points, wherein said model of an etch process comprises includes calculating a convolution of a point-spread-function with a photoresist pattern density; and
   d) synthesizing a photomask data set based on a model of a lithography process and the set of lithography-target points.

21. A photomask made using the method defined by claim 20.

22. A computer readable medium comprising computer executable instructions to cause a computer to:
   a) provide a set of target polygons for said target layout;
   b) fit a smooth curve to a target polygon of said set of target polygons, the curve having a set of etch-target points;

c) move the etch target points according to a model of an etch process to produce a set of lithography-target points, wherein said model of an etch process comprises calculating how much of a region above a wafer is visible from a point on the sidewall of an etched feature in the wafer; and d) synthesize a photomask data set based on a model of a lithography process and the set of lithography-target points.

23. The computer readable medium as defined by claim 22, wherein said target layout is applicable to a region of a chip, and further compromising repeating the computer executable instructions for at least one further region of the chip.

24. The computer readable medium as defined by claim 22, wherein said steps (b) and (c) are performed for other polygons of said set of polygons.

25. The computer readable medium as defined by claim 24, wherein said model of an etch process of step (c) has adjustable parameters, the computer executable instructions adapted to further cause the computer to:
print a test pattern in photoresist on a wafer thereby forming a photoresist pattern;
measure critical dimensions of the photoresist pattern;
etch a pattern into a layer on a wafer;
measure critical dimensions of the etched pattern; and
select the adjustable parameters of the model of the etch process according to the measured critical dimensions of the photoresist pattern and the measured critical dimensions of the etched pattern.

26. The computer readable medium as defined by claim 22, wherein said smooth curve of step (b) substantially matches the target polygon, except at its vertices.

27. The computer readable medium as defined by claim 26, wherein said smooth curve of step (b) comprises an etch target curve on which said etch target points lie.

28. The computer readable medium as defined by claim 22, wherein said model of an etch process of step (c) comprises calculating a convolution of a point-spread-function with a photoresist pattern density.

29. The computer readable medium as defined by claim 22, wherein said model of an etch process of step (c) has adjustable parameters, the computer executable instructions adapted to further cause the computer to:
print a test pattern in photoresist on a wafer thereby forming a photoresist pattern;
measure critical dimensions of the photoresist pattern;
etch a pattern into a layer on a wafer;
measure critical dimensions of the etched pattern; and
select the adjustable parameters of the model of the etch process according to the measured critical dimensions of the photoresist pattern and the measured critical dimensions of the etched pattern.

30. The computer readable medium as defined by claim 29, wherein said selecting step further comprises substantially minimizing a weighted sum of squares of differences between predictions of the model of the etch process and measured critical dimensions.

31. The computer readable medium as defined by claim 22, wherein said step (d) of synthesizing a photomask data set further comprises calculating edge placement errors at a plurality of lithography target points.

32. The computer readable medium as defined by claim 31, wherein said step of synthesizing a photomask further comprises calculating how much a resist edge is displaced in response to a change in an exposure dose or defocus.

33. The computer readable medium as defined by claim 22, wherein said step (c) utilizes an algorithm selected from the group consisting of a Overmars-Welzl Algorithm, a Ghosh-Mount Algorithm, and a Lee Algorithm, for constructing a visibility graph in a plane.

34. A computer readable medium comprising computer executable instructions to cause a computer to:
a) provide a set of target polygons for said target layout;
b) fit a smooth curve to a target polygon of said set of target polygons, the curve having a set of etch-target points;
c) move the etch target points according to a model of an etch process to produce a set of lithography-target points; and
d) synthesize a photomask data set based on a model of a lithography process and the set of lithography-target points and wherein synthesizing a photomask data set further comprises:
calculating an image intensity at a plurality of lithography target points according to the model of the lithography process;
calculating a figure-of-demerit comprising a sum of differences between the calculated image intensities and predetermined values, wherein the sum is evaluated over said plurality of lithography target points; and
adjusting the photomask data in a way that decreases the said figure-of-demerit.

35. The computer readable medium as defined by claim 34, wherein said step of calculating a figure-of-demerit further comprises calculating how much a resist edge moves in response to a change in a lithography exposure dose.

36. The computer readable medium as defined by claim 34, wherein said step of calculating a figure-of-demerit further comprises calculating how much a resist edge moves in response to a change in a lithography defocus parameter.

37. The computer readable medium as defined by claim 34, wherein said step of calculating a figure-of-demerit further comprises calculating an image slope.

38. A computer readable medium comprising computer executable instructions to cause a computer to:
a) provide a set of target polygons for said target layout;
b) fit a smooth curve to a target polygon of said set of target polygons, the curve having a set of etch-target points;
c) move the etch target points according to a model of an etch process to produce a set of lithography-target points, wherein said model of an etch process comprises includes calculating a convolution of a point-spread-function with a photoresist pattern density; and
d) synthesize a photomask data set based on a model of a lithography process and the set of lithography-target points.

39. A computer-aided design apparatus configured to synthesize a photomask data set from a given target layout, comprising
a processor;
a memory connected to the processor; and
a computer readable medium having instructions embedded therein, the instructions configured to cause the processor to perform the operations of:
a) providing a set of target polygons for said target layout;
b) fitting a smooth curve to a target polygon of said set of target polygons, the curve having a set of etch-target points;
c) moving the etch target points according to a model of an etch process to produce a set of lithography-target points, wherein said model of an etch process comprises calculating how much of a region above a wafer is visible from a point on the sidewall of an etched feature in the wafer; and d) synthesizing a photomask data set based on a model of a lithography process and the set of lithography-target points.

40. The computer-aided design apparatus of claim 39, wherein said target layout is applicable to a region of a chip, and further compromising repeating the operations for at least one further region of the chip.

41. The computer-aided design apparatus of claim 39, wherein said steps (b) and (c) are performed for other polygons of said set of polygons.

42. The computer-aided design apparatus of claim 41, wherein said model of an etch process of step (c) has adjustable parameters, the instructions configured to further cause the processor to perform the operations of:
   printing a test pattern in photoresist on a wafer thereby forming a photoresist pattern;
   measuring critical dimensions of the photoresist pattern;
   etching a pattern into a layer on a wafer;
   measuring critical dimensions of the etched pattern; and
   selecting the adjustable parameters of the model of the etch process according to the measured critical dimensions of the photoresist pattern and the measured critical dimensions of the etched pattern.

43. The computer-aided design apparatus of claim 39, wherein said smooth curve of step (b) substantially matches the target polygon, except at its vertices.

44. The computer-aided design apparatus of claim 43, wherein said smooth curve of step (b) comprises an etch target curve on which said etch target points lie.

45. The computer-aided design apparatus of claim 39, wherein said model of an etch process of step (c) comprises calculating a convolution of a point-spread-function with a photoresist pattern density.

46. The computer-aided design apparatus of claim 39, wherein said model of an etch process of step (c) has adjustable parameters, the instructions configured to further cause the processor to perform the operations of:
   printing a test pattern in photoresist on a wafer thereby forming a photoresist pattern;
   measuring critical dimensions of the photoresist pattern;
   etching a pattern into a layer on a wafer;
   measuring critical dimensions of the etched pattern; and
   selecting the adjustable parameters of the model of the etch process according to the measured critical dimensions of the photoresist pattern and the measured critical dimensions of the etched pattern.

47. The computer-aided design apparatus of claim 46, wherein said selecting step further comprises substantially minimizing a weighted sum of squares of differences between predictions of the model of the etch process and measured critical dimensions.

48. The computer-aided design apparatus of claim 39, wherein said step (d) of synthesizing a photomask data set further comprises calculating edge placement errors at a plurality of lithography target points.

49. The computer-aided design apparatus of claim 48, wherein said step of synthesizing a photomask further comprises calculating how much a resist edge is displaced in response to a change in an exposure dose or defocus.

50. The computer-aided design apparatus of claim 39, wherein said step (c) utilizes an algorithm selected from the group consisting of a Overmars-Welzl Algorithm, a Ghosh-Mount Algorithm, and a Lee Algorithm, for constructing a visibility graph in a plane.

51. A computer-aided design apparatus configured to synthesize a photomask data set from a given target layout, comprising
   a processor;
   a memory connected to the processor; and
   a computer readable medium having instructions embedded therein, the instructions configured to cause the processor to perform the operations of:
      a) providing a set of target polygons for said target layout;
      b) fitting a smooth curve to a target polygon of said set of target polygons, the curve having a set of etch-target points;
      c) moving the etch target points according to a model of an etch process to produce a set of lithography-target points; and
      d) synthesizing a photomask data set based on a model of a lithography process and the set of lithography-target points and wherein synthesizing a photomask data set further comprises:
         calculating an image intensity at a plurality of lithography target points according to the model of the lithography process;
         calculating a figure-of-demerit comprising a sum of differences between the calculated image intensities and predetermined values, wherein the sum is evaluated over said plurality of lithography target points; and
         adjusting the photomask data in a way that decreases the said figure-of-demerit.

52. The computer-aided design apparatus of claim 51, wherein said step of calculating a figure-of-demerit further comprises calculating how much a resist edge moves in response to a change in a lithography exposure dose.

53. The computer-aided design apparatus of claim 51, wherein said step of calculating a figure-of-demerit further comprises calculating how much a resist edge moves in response to a change in a lithography defocus parameter.

54. The computer-aided design apparatus of claim 51, wherein said step of calculating a figure-of-demerit further comprises calculating an image slope.

55. A computer-aided design apparatus configured to synthesize a photomask data set from a given target layout, comprising
   a processor;
   a memory connected to the processor; and
   a computer readable medium having instructions embedded therein, the instructions configured to cause the processor to perform the operations of:
      a) providing a set of target polygons for said target layout;
      b) fitting a smooth curve to a target polygon of said set of target polygons, the curve having a set of etch-target points;
      c) moving the etch target points according to a model of an etch process to produce a set of lithography-target points, wherein said model of an etch process comprises includes calculating a convolution of a point-spread-function with a photoresist pattern density; and
      d) synthesizing a photomask data set based on a model of a lithography process and the set of lithography-target points.

* * * * *

UNITED STATES PATENT AND TRADEMARK OFFICE
CERTIFICATE OF CORRECTION

PATENT NO. : 7,600,212 B2
APPLICATION NO. : 11/541921
DATED : October 6, 2009
INVENTOR(S) : Zach et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 217 days.

Signed and Sealed this

Fifth Day of October, 2010

David J. Kappos
*Director of the United States Patent and Trademark Office*